US005749433A

United States Patent [19]

Jackson

[11] Patent Number: 5,749,433

[45] Date of Patent: May 12, 1998

[54] MASSLINE LOUDSPEAKER ENCLOSURE

[76] Inventor: Michael Jackson, 4524 N. 35th Pl., Phoenix, Ariz. 85018

[21] Appl. No.: 600,497

[22] Filed: Feb. 13, 1996

[51] Int. Cl.$^6$ .................... H05K 5/00

[52] U.S. Cl. .................... 181/156; 181/199

[58] Field of Search .................... 181/148, 155, 181/156, 199

[56] References Cited

U.S. PATENT DOCUMENTS

| | | | |
|---|---|---|---|
| 2,775,309 | 3/1956 | Vilchur | 181/158 |
| 3,667,568 | 6/1972 | Liebscher | 181/156 |
| 3,917,024 | 11/1975 | Kaiser | 181/163 |
| 4,076,097 | 2/1978 | Clarke | 181/147 |
| 4,139,075 | 2/1979 | Kobayashi | 181/148 |
| 4,142,603 | 3/1979 | Johnson | 181/148 |
| 4,146,111 | 3/1979 | Mae et al. | 181/154 |
| 4,301,332 | 11/1981 | Dusanek | 181/144 |
| 4,410,064 | 10/1983 | Taddeo | 181/152 |
| 4,436,178 | 3/1984 | Gieger | 181/151 |
| 4,549,631 | 10/1985 | Bose | 181/155 |
| 4,598,789 | 7/1986 | Ritter | 181/144 |
| 4,700,177 | 10/1987 | Nakashima | 181/163 |
| 4,875,546 | 10/1989 | Kran | 181/160 |
| 4,924,963 | 5/1990 | Polk | 181/144 |
| 4,939,783 | 7/1990 | Dunning | 181/171 |
| 5,092,424 | 3/1992 | Schreiber | 181/145 |
| 5,150,417 | 9/1992 | Stahl | 181/144 |
| 5,204,501 | 4/1993 | Tsao | 181/156 |
| 5,517,573 | 5/1996 | Polk et al. | 181/159 |

*Primary Examiner*—Eddie C. Lee

*Attorney, Agent, or Firm*—LaValle D. Ptak

[57] ABSTRACT

A loudspeaker system comprises a housing consisting of three interconnected sealed enclosures. The primary sealed enclosure has an aperture in it in which a loudspeaker is mounted in a sealed relationship. This enclosure is interconnected with an intermediate sealed enclosure located between it and a third or output enclosure. The intermediate sealed enclosure has an aperture communicating between it and the interior of the primary sealed enclosure. A first passive plate is movably mounted in this aperture in sealed relationship. A second passive plate is movably mounted in an aperture between the second enclosure and the output enclosure in sealed relationship to form a sealed airspace between the first and second passive plates. The output enclosure has a port in it for communication with the air surrounding the enclosures. The system provides low frequency bandwidth and reduced distortion in a composite system, which has a significantly reduced volume compared with conventional speaker enclosures providing comparable low frequency response.

21 Claims, 2 Drawing Sheets

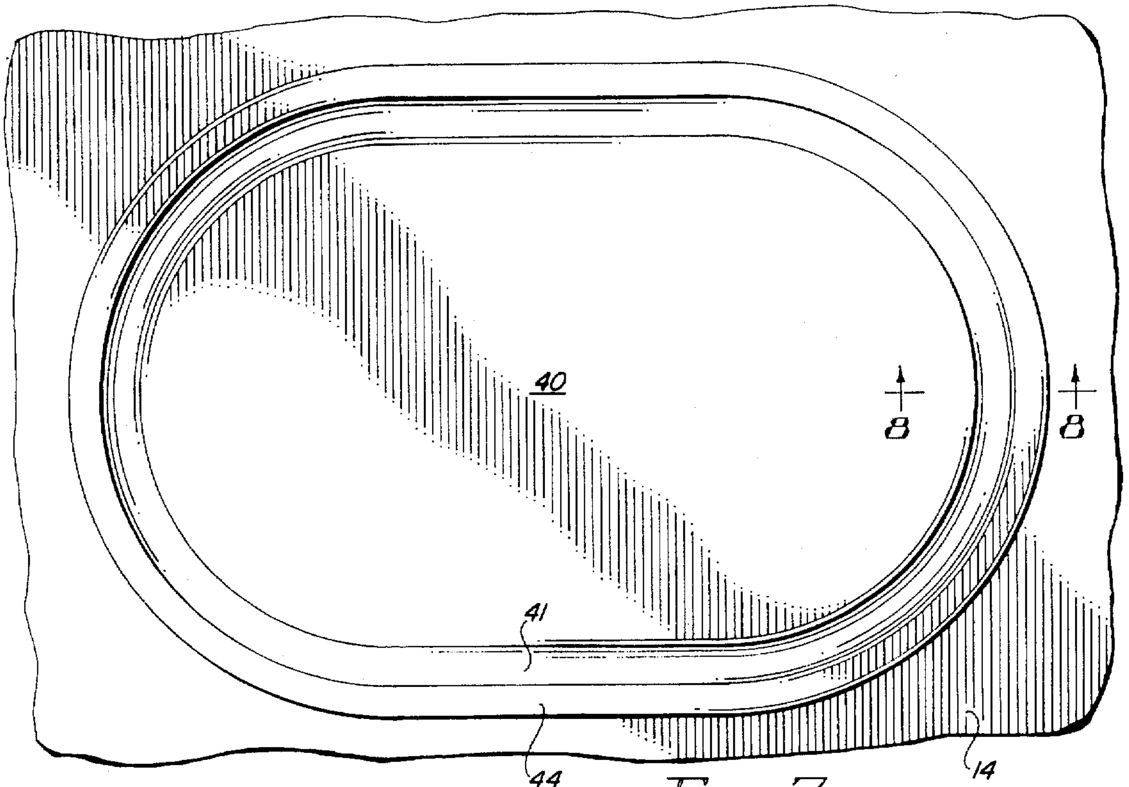
FIG. 7
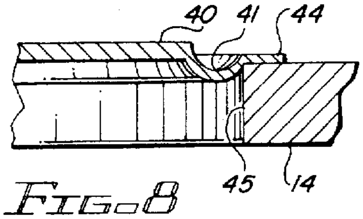
FIG. 8
FIG. 9
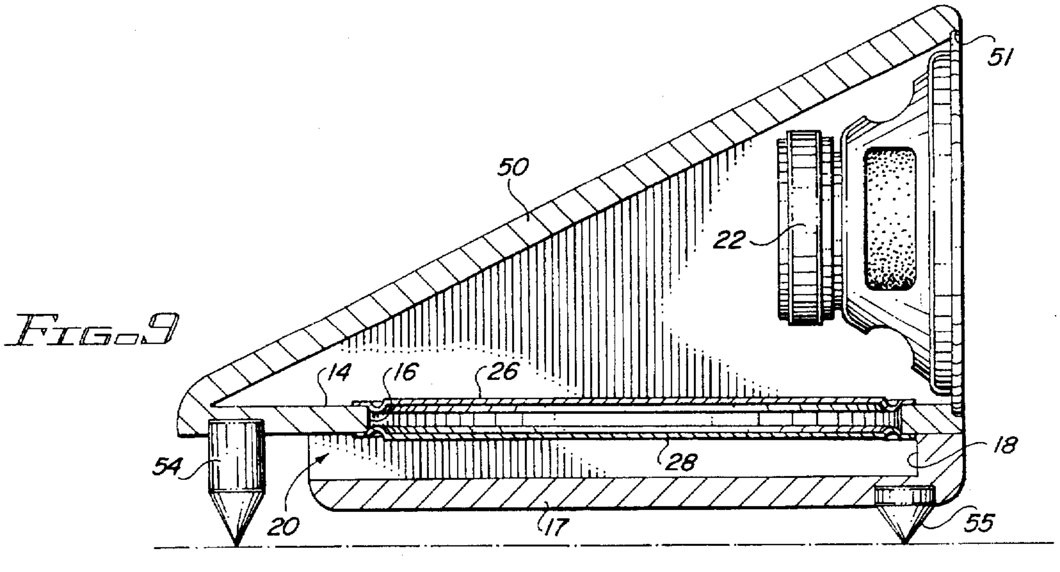

MASSLINE LOUDSPEAKER ENCLOSURE

BACKGROUND

Loudspeaker enclosures designed to provide good, low frequency (bass) response are manufactured in a variety of configurations. The production of good low frequency signal quality, however, in the past, typically requires a relatively large volume speaker enclosure.

Examples of prior art large speaker enclosures for producing accurate low frequency response are acoustic suspension speakers, such as shown in the U.S. patent to Vilchur U.S. Pat. No. 2,775,309; and bass reflex speakers (based on 19th century Helmholtz resonant chamber physics), as shown in the U.S. patents to Cran U.S. Pat. No. 4,875,546; Taddeo U.S. Pat. No. 4,410,064 and Bose U.S. Pat. No. 4,549,631. Other bass speaker enclosures use infinite baffle or transmission line and acoustic labyrinth types, employing a tuned pipe with a large volume of air to reinforce, and thereby increase, the low frequency bandwidth. Exponential or folded low frequency horns and other types of speakers have been developed. All of the enclosures for these speakers, however, require relatively large volume cabinets with limited low frequency bandwidth or compromised efficiency.

Variations of the bass speaker enclosures mentioned above have been made, in efforts to improve the overall speaker performance, with passive radiators mounted in the speaker enclosure, in addition to the active radiator of the loudspeaker, which is driven by the input signals. One such loudspeaker system is disclosed in the U.S. patent to Dusanek U.S. Pat. No. 4,301,332. The Dusanek system employs a structure which utilizes a pair of inner and outer passive radiators, with a sealed airspace between them. The radiators are coupled with the active speaker located at the opposite wall of the second chamber of the loudspeaker structure. The two passive radiators, however, are rigidly coupled together to cause them to move together. As a consequence, the coupling between them is mechanical; and it is not determined by the sealed airspace between them. Since the radiators move together, the airspace between them is not compressed or expanded as these passive radiators move. The second or outer passive radiator of the pair also is coupled directly to the air outside the speaker enclosure.

The U.S. patent to Tsao U.S. Pat. No. 5,204,501 employs a sealed speaker enclosure, which has a "resonance" plate located at the rear of the sealed speaker. This plate operates against an enclosed airspace for increasing the driving power of the speaker. The plate, however, is mounted by expansion gasket, which will severely limit its acoustic sensitivity. The interior rear baffle plate of this speaker also is perforated to allow air from the primary chamber to pass through passage holes to an annular air compensation chamber against the opposite side of the "resonance" plate. The effect of this is to apply the same wave to both sides of the resonance plate or membrane, which causes a cancellation of signal to the extent of the air which passes through the holes to the opposite side of the passive or resonance plate.

Some prior art bass speakers and enclosures employ a passive radiator used in combination with the dynamic driver. In such speakers, the air mass within the enclosure must increase to allow for the added mass and resonance of the passive device, or an undamped (ringing or uncontrolled) movement of both the active and passive devices will result. This creates an undesired large peak or emphasis at an undesired upper point in the frequency response of the overall mechanism.

It is desirable to provide a compact, inexpensive, efficient loudspeaker with a wide low frequency bandwidth, which overcomes the disadvantages of the prior art speaker systems.

SUMMARY OF THE INVENTION

It is an object of this invention to provide an improved loudspeaker system.

It is another object of this invention to provide an improved loudspeaker enclosure for low frequency sound reproduction.

It is an additional object of this invention to provide an improved compact loudspeaker enclosure for low frequency sound reproduction.

It is a further object of this invention to provide an improved reduced volume loudspeaker enclosure for low frequency sound reproduction over a relatively wide bandwidth.

In accordance with a preferred embodiment of this invention, a speaker enclosure comprises a primary sealed enclosure, with at least first and second walls in it. A first aperture is formed through the first wall for mounting a loudspeaker of complementary dimensions in the aperture. A second aperture is formed through the second wall of the primary enclosure, and a movable passive plate is mounted in this second aperture to seal the second aperture against the passage of air therethrough. An elongated sealed cavity then is attached to the second wall on the opposite side of the passive plate. An open slot in this latter cavity is located in a plane, which is perpendicular to the plane of the second wall, to communicate with the ambient air surrounding the enclosure.

In a more specific embodiment, the aperture in the second wall has a pair of passive, movable plates mounted in it, spaced a short distance apart sufficient to prevent mechanical interference of the passive plates with one another. The two plates form a sealed airspace between them; and the combined mass of these plates is selected to be greater than the moving mass of the driven loudspeaker. This structure essentially causes the speaker enclosure to be in the form of a series of three sealed enclosures, namely, the primary sealed enclosure, the sealed enclosure between the passive movable plates, and the output enclosure, in which the open slot is formed.

BRIEF DESCRIPTION OF THE DRAWINGS

FIG. 7 is a top view of an alternative to a portion of the structure used in the embodiment of FIGS. 1 and 2;

FIG. 8 is a cross-sectional detail taken along the-line 8—8 of FIG. 7; and

FIG. 9 is a cross-sectional view of an alternative to the embodiment shown in FIG. 1.

DETAILED DESCRIPTION

Reference now should be made to the drawings, in which the same reference numbers are used throughout the different figures to designate the same components. A preferred embodiment of a low frequency or bass loudspeaker enclosure 10 is illustrated in FIGS. 1 through 6.

Figure 1:
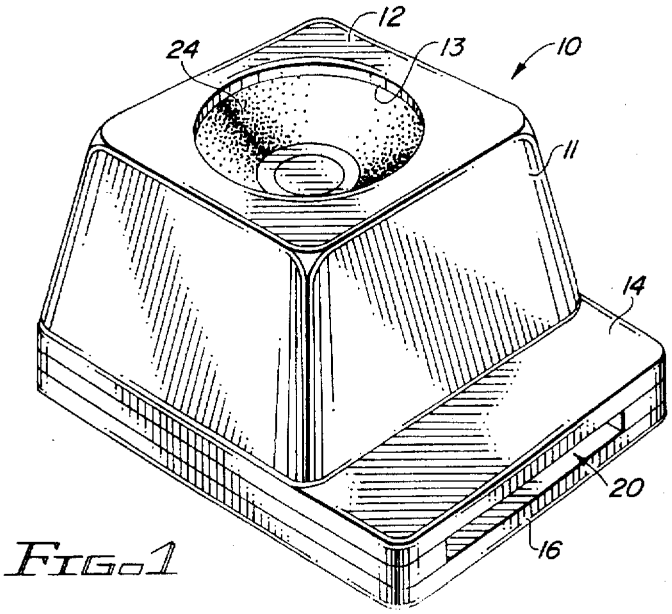
FIG. 1 is a top perspective view of a preferred embodiment of the invention.
Figure 3:
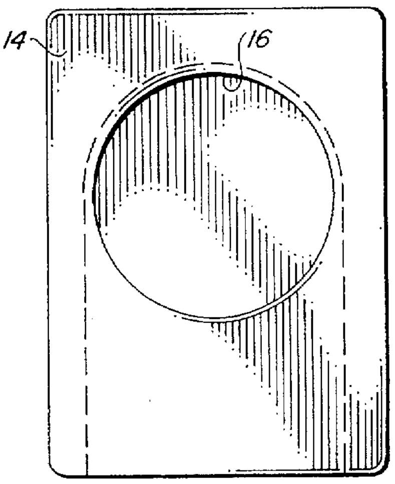
FIG. 3 is a cross-sectional view taken along the line 3—3 of FIG. 2.

As shown in FIG. 1, the speaker enclosure 10 comprises an upper or primary sealed enclosure having four perpendicular trapezoidal sides or walls 11, with a flat top 12 and a flat bottom 14, which extends parallel to the top 12 on the front of the speaker beyond the front side 11. A circular aperture 13 is formed in the center of the top 12; and a dynamic loudspeaker 22, having a speaker cone 24, is mounted in a sealed relationship in the aperture 13, as illustrated most clearly in FIGS. 1 and 2.

The mounting of the speaker 22 generally is effected by placing the speaker on the inside of the volume enclosed by the primary sealed enclosure, consisting of the walls 11 and top and bottom 12 and 14. This provides a more pleasing aesthetic appearance to the speaker, as is evident from FIG. 1; but the speaker 22 could be mounted outside the enclosure 10 on the top surface 12 facing downwardly, if desired. Alternatively, a pair of speakers 22 and 25 (shown in dotted lines in FIGS. 2 and 6) may be mounted in a face-to-face relationship in the aperture 13. When this configuration is used, the speakers 22 and 25 are driven 180° out of phase (push-pull) with one another with the same input signals. Whether one speaker 22 is used, or whether two speakers 22 and 25 are used, however, the overall operation of the speaker enclosure 10 is the same. It is important to seal the aperture or opening 13 in the top 12 with the speaker 22 (or 22 and 25); so that no air transference between the inside and the outside of the enclosure 10 takes place around the edge of the moving cone(s) 24 of the speaker.

As shown most clearly in FIGS. 2 through 5, the bottom panel 14 of the enclosure 10 has a pair of spaced, generally rigid, circular, passive radiators or passive plates 26 and 28 mounted in an aperture 16 in the panel 14. The plate 26 is mounted around its edge, with a rubber speaker annulus or other suitable type of "movable" hinge to permit mechanical excursions of the plate 26 within the aperture 16 in the bottom panel 14 of the enclosure. Similarly, the passive radiator or plate 28 is mounted by means of a rubber speaker annulus 34 on the bottom of the bottom panel 14 in the opening or aperture 16. As illustrated most clearly in FIG. 5, the rubber hinges or annuli 30 and 34 each include, respectively, outwardly extending flanges 31 and 35, which are secured to the opposite sides of the bottom 14 of the housing to form a sealed airspace between the plates 26 and 28. Since the plate 26 is sealed in the opening 16, it also seals the enclosure holding the speaker 22 against the passage of air into or out of this enclosure.

It also should be noted that the area of each of the plates 26 and 28 is greater than the radiating surface area of the speaker cone 24. In addition, the combined mass of the plates 26 and 28 is selected to be greater than the moving mass of the dynamic loudspeaker 22/24 in a manner described more fully hereinafter. To achieve this mass, the plates 22 and 24 may be made of any suitable material, such as cardboard or fiberboard.

The speaker enclosure is completed by a third sealed enclosure formed by a three-sided spacer 18 and a flat bottom panel 17, which is parallel to the top 13 and bottom 14 of the upper or primary enclosure. This narrow, elongated enclosure opens in a slot 20 at the front of the speaker. Again, as is apparent from an examination of FIGS. 1 and 6, the slot 20 is an elongated rectangular slot, the vertical dimension of which is determined by the space between the panels 14 and 17 and the width of which is determined by the width of the spacer 18 at the opening in the front of the speaker enclosure 10, as shown in FIG. 1. The result of this structure is a loudspeaker enclosure comprising three interconnected sealed enclosures, with the lowermost or third enclosure opening into the ambient air surrounding the speaker through the elongated rectangular slot 20. The slot 20 is tuned to the resonant frequency of the system.

Figure 6:
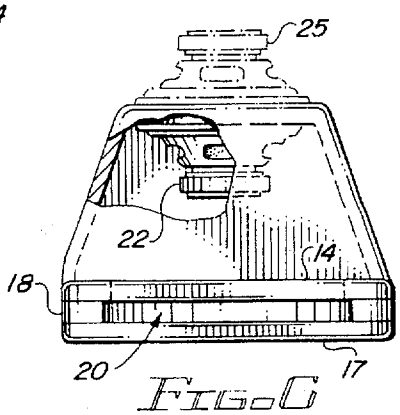
FIG. 6 is a front, partial cross-sectional view of the embodiment shown in FIG. 1.

It has been found that by utilizing the lower or output enclosure or chamber formed by the spacer 18 and the bottom 17 in combination with the passive plate "sandwich" of the plates 26 and 28, the overall volume of the entire speaker system or enclosure 10 may be reduced by approximately sixty-six percent (66%) over optimum critically damped speaker enclosures which use a passive radiator coupled directly to the free air or ambient air surrounding the speaker enclosure. The volume reduction is significant; and the sound reproduction has been found to be accurate and of high quality. Due to the fact that the loudspeaker enclosure shown in FIG. 1 is smaller than conventional enclosures, interfering reflecting standing waveforms (dominant, resonant, half-wavelength and quarter-wavelength resulting from the interior boundary dimensions) are entire frequencies (shorter wavelengths) than conventional larger enclosures. The distortion resulting from the resonance of such shorter wavelength waveforms remains at the upper end of the usable bandwidth; so that it contributes less interference lower into the bandwidth. The result is that the system inherently has less distortion than conventional larger speaker enclosures. Because the output slot 20 is of a relatively small area, and particularly since the vertical height (as shown in FIGS. 1 and 6) of the slot is quite small (typically, three-fourths inch for an 8" driver 22), the output slot 20 may be located in automotive or other environments which could not accommodate the area required for a conventional loudspeaker system. The opening of the output slot 20 should not be obstructed unless the obstruction and the length of the slot 20 is configured to allow for laminar air flow.

Another advantage of the speaker enclosure shown in FIGS. 1 through 6 is a rapid roll off or low frequency rejection below the lowest usable frequency (3 db down power point), which acts to protect the moving portions of the system from unnecessary excursion.

The passive plates (such as 26 and 28 of FIG. 1) may be of any convenient shape to accommodate design requirements or to provide optimum surface area within the constraints of the system. Thus, FIGS. 7 and 8 illustrate a variation of a portion of the speaker system shown in FIGS. 1 through 6. Instead of employing a circular aperture 16 in the bottom 14 of the primary or upper enclosure, an elongated oval opening 45 is provided in the panel 14. An oval-shaped passive radiator 40 then is mounted by means of a rubber speaker annulus or other suitable movable hinge 41, having a flange 44 extending over the surface of the bottom 14, as illustrated in FIGS. 7 and 8. This flange 44 is attached to the bottom 14 by means of a suitable adhesive to seal the plate 40 in the opening 45 to provide an airtight enclosure, in the same manner as the plate 26 of the embodiment of FIGS. 1 through 6 seals the opening 16 to provide an airtight enclosure for the upper or primary enclosure housing the dynamic loudspeaker 22.

Also, as illustrated in FIGS. 7 and 8, only a single oval plate 40 is employed; and, as shown in FIG. 8, it is connected in the upper side of the opening 45 in the bottom 14. It is possible to use a single plate such as 40, or a single plate such as the plate 26 of the embodiment of FIGS. 1 through 6, provided the mass of the single plate 26 or the oval plate 40 is sufficiently greater than the moving mass of the loudspeaker 22 to provide the desired operating characteristics. It has been found, however, that in some cases the amount of mass required is sufficiently great that if a single passive radiator such as 26 or 40 is used, sagging of the mass on the rubber mounting annulus 41 (for the embodiment shown in FIGS. 7 and 8) or 30 (for the embodiment shown in FIGS. 2 and 5) results. This, in turn, can result in some performance degradation. As a consequence, it has been found preferable in most cases to use a pair of passive radiators, such as 26 and 28 of the embodiment of FIGS. 1 through 6. In the variation shown in FIGS. 7 and 8, however, a single radiator is employed, since the overall operation of the system is otherwise similar, whether two passive radiators with a sealed airspace between them are used, or a single radiator, such as shown in FIGS. 7 and 8, is used. Whether a single radiator plate 40 is used or a sandwich pair 26, 28, the greater the surface area, the wider is the low frequency bandwidth of the system.

FIG. 9 illustrates a variation of the overall structure of the embodiment shown in FIGS. 1 through 6, but which employs all of the same operating principles. For the embodiment shown in FIG. 9, only a side cross section is employed. The upper enclosure is in the form of a flat wedge shape, with an upper flat top 50 sloping downwardly from the rear to connect with the bottom 14 of the enclosure. A pair of vertical sides (not shown in FIG. 9) close the two sides of the speaker; and a rectangular rear wall closes the back. The rear wall has a circular aperture 51 formed in it, in which the dynamic loudspeaker 22 is mounted in the same manner described above in the description of FIGS. 1 through 6.

The bottom 14 of the speaker enclosure shown in FIG. 9 has a circular aperture or opening 16 formed in it; and a pair of circular passive radiator plates 26 and 28 are mounted in this opening in the same manner described above in conjunction with the embodiment of FIGS. 1 through 6. The bottom wall 14 of the lower enclosure opens to a front slot 20 in the same manner illustrated in FIGS. 1 and 6. A set of legs 54 and 55 are placed on the members 14 and 17 to support the speaker enclosure of the embodiment shown in FIG. 9.

The speaker enclosure system of FIG. 9 operates in the same manner as the speaker enclosure system in FIG. 1. It also should be noted that in the embodiment shown in FIG. 9, the loudspeaker 22 is mounted in one of the side walls (the rear wall) instead of in the top of the enclosure. Such a mounting also could be employed with the enclosure of FIG. 1 if desired, since the particular location of the mounting of the dynamic loudspeaker 22 in the sealed upper portion of the enclosure is not important. The operation of the speaker system is the same, whether the configuration of FIG. 9 is used or the configuration of FIG. 1 is used.

Clearly, other physical shapes or configurations may be employed, in addition to the ones illustrated. For example, instead of employing the trapezoidal sides shown in the embodiment of FIG. 1, the sides 11 could be mutually perpendicular vertical rectangular sides. The operation of the enclosure would be the same with such a construction.

In order for the speaker system to properly perform, the various components have their operating parameters matched to one another. The manner in which this matching is effected will now be described.

In the ensuing calculations, "P" is the density of air in Kilograms per cubic meter; "Co" is the speed of sound in meters per second.

The speaker enclosures shown in FIGS. 1 and 9 typically are used with standard medium-sized drivers, such as an eight inch driver or twelve inch driver. For the following calculations, the speaker 22 is an 8" driver. Thus, the driver radiating area (sd) is: sd=0.0230 square centimeters. For any given speaker, to take advantage of the design of the massline speaker enclosures, relatively compliant drivers are chosen. Using such drivers in conjunction with the design of the speakers described in conjunction with FIGS. 1 through 9 above, permits the volume of the enclosure to be as much as sixty-six percent (66%) smaller compared with prior art speaker enclosures having the same resonant frequencies. To do this, the drivers typically have a compliance of $1.0\times10^3$ meters per Newton or higher. The complementary movement of the passive plates 26, 28 or 40 is damped, and is controlled via the compliance of the very small, higher resonant, sealed enclosure on the one side and the impedance of the port air mass on the other. Because of the small size of the sealed enclosure (the upper enclosure in the embodiments of FIGS. 1 and 2 and of FIG. 9), the plates 26, 28 or 40 become the dominant resonant factor toward the −3 dB point. The upper enclosure resonance, therefore, is isolated more to the upper part of the usable bandwidth than conventional speakers. Within the excursion (Xmax) limits of the passive plate complement, signal quality actually improves when the upper part of the bandwidth downward toward the −3 dB or half-power point. A small sensitive wide bandwidth loudspeaker is economically produced utilizing the system.

Figure 2:
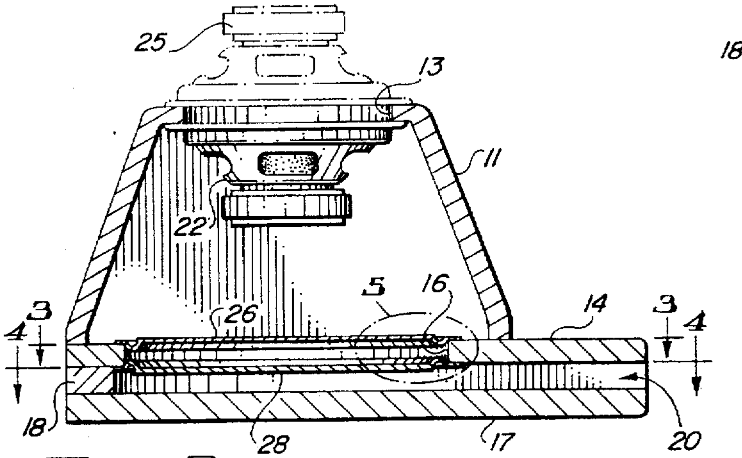
FIG. 2 is a cross-sectional side view of the embodiment shown in FIG. 1.
Figure 4:
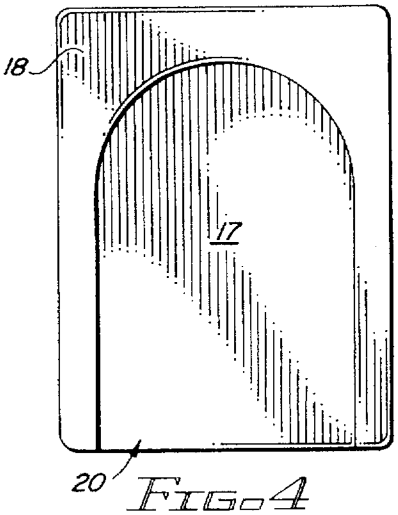
FIG. 4 is a cross-sectional view taken along the line 4—4 of FIG. 2.
Figure 5:
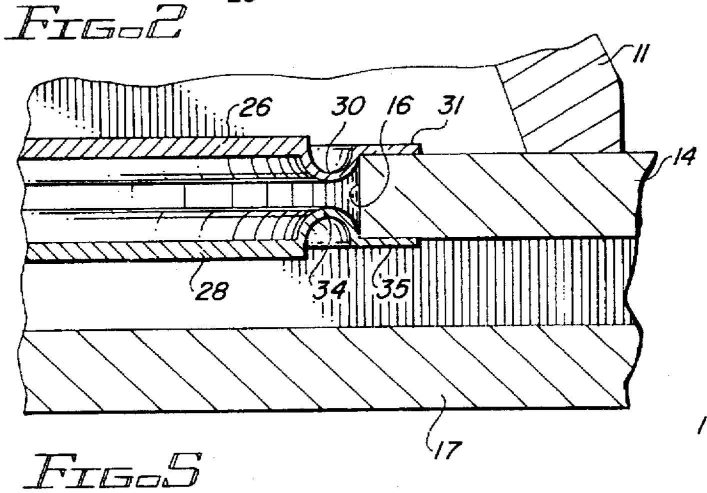
FIG. 5 is an enlarged detail of the portion circled as "5" in FIG. 2.

The first step in the production of a system to produce the loudspeakers discussed above in conjunction with FIGS. 1 through 9 is to define the system enclosure size for any given active driver using Theil-Small parameters. Once the speaker is selected, the following calculations may be made to determine the other parameters of the sealed upper (as shown in FIGS. 1, 2 and 9) enclosure. Although the following formula development clearly may be used with different sized speakers, having different compliance, the application of the system formula is provided below for an eight inch speaker having the compliance and resonant characteristics noted below:

| | |
|---|---|
| 1. Active driver mass | (Md) = 48 grams |
| 2. Active driver compliance | $(Cd) = 1.09 \times \frac{10^{-3\,Meters}}{Newton}$ |
| 3. Active driver resonance | $(Fs) = \frac{1}{2pi \times \sqrt{Cd \times Md}} = 22.003$ Hz |
| 4. Active driver mechanical mass impedance at resonance | $(X1) = Md \times 2\ pi \times Fs = 6.636$ Kg $sec^2$ |

General usable range of box/driver system Q exists between 0.55 and 0.85. The term Qs is used here to define that range. Optimal Q is at 0.7.

| | |
|---|---|
| 6. Box/driver resonance | $Fb(Qs) = \frac{Qs}{Qta} \times Fs$ |
| 7. Mechanical driver impedance over a usable tuning range | $Mxd(Qs) = 2\,pi \times Fb\,(Qs) \times Md$ |
| 8. Equivalent box compliance required to achieve desired system Q. | $Cb\,(Qs) = \frac{1}{2pi \times Fb(Qs) \times Mxd(Qs)}$ |
| 9. Box compliance required to achieve total desired system compliance. | $Cb1\,(Qs) \frac{1}{\{2pi \times Fb(Qs) \times Mxd(Qs)\} - \frac{1}{Cd}}$ |

10. To calculate the required box volume these factors are used:

| | |
|---|---|
| a. Driver radiating area | $(Sd) = 230\ cm^2$ |
| b. Density of air | $(P) = 1.2\ Kg\ M^{-3}$ |
| c. Speed of sound | $(Co) = 343\ M\ sec^{-1}$ |
| 12. Thus box volume is derived according to a desired system Q | $(Vb)\,(Qs) = PxCo^2xSd^2xCb1(Qs)\,\frac{xm^3}{in^3}$ |

The second step in the design of a massline speaker enclosure system is the development of the passive plate complement. The passive plate complement works both as a filter against unwanted resonance, in accordance with the box driver relationship described in Step 1 above, and provides the simple resonant sensitivity for extended low frequency bandwidth in the enclosure design. The distance between the plates 26 and 28 in a typical two-plate sandwich design has been determined not to exceed twenty percent of the volume of the upper sealed enclosure in order to provide the greatest coupling between the initial plate (26) and the secondary plate (28) and to not allow for a secondary resonance to occur between the plates. Thus, the plate area and mass are based on cabinet dimension requirements, with a minimum plate size determined by maximum linear sound pressure level (SPL) and the system 3 dB down or half-power point. In general, the plate mass reflected on the active driver on each plate for a pair is targeted to be near twenty-five percent to thirty-three percent of the active driver mass. The following calculations apply (once again, based on the actual eight-inch driver example used in Step 1):

| | |
|---|---|
| 1. Plate mechanical mass | $Mm = Ma \times S^2$ |
| 2. Plate acoustic mass | $Ma = \frac{Mn}{S^2}$ |
| 3. Plate diameter with half the annulus figured as radiating | (Pd) = 10.25 inches |
| 4. Active driver radiating area | $(Sd) = 0.023\ M^2$ |
| 5. Passive driver radiating area | $(Sp) = 0.053\ M^2$ |
| 6. Mechanical mass of each plate | (Mmp) = 0.078 Kg |
| 7. Plate reflected mass | $(Mr) = Mmp \times (Sd/Sp)^2 = 0.15\ Kg$ |

Step 3 of the design is the design of the port 20 to incorporate an air load mass that will typically fall between thirty percent to fifty percent of the moving mass (Md) of the active driver 22. The Md of the eight-inch driver used in the foregoing development continues to be used here as a model; and this mass is 48 grams, as defined above. Based on this, the reflected mass is developed as follows:

| | |
|---|---|
| 1. Port length measured from center of plate to port aperture | L = 6" |
| 2. Port width | W = 10" |
| 3. Port height | H = .75 " |
| 4. Port air mass calculation ($Kg \times M^{-4}$, the term, implies a pressure applied to the contained air mass) | $(Ma) = \frac{P \times L}{W \times H} = 37.795\ Kg \times M^{-4}$ |
| 5. Port reflected mass | $(Mpr) = Ma \times (Sd^2) = 0.02\ Kg$ |

The final step, Step 4, in the development is to determine the sound pressure level (SPL) target performance for the desired frequency response. To do this, the plate movement limits of the plates 26, 28 or 40 must be known. As an arbitrary model, an eight-inch diameter passive plate (26 and 28) is illustrated here. The movement limit of the plate is determined from the manufacturer's specifications; and, for such a plate the following calculations are made to obtain the achievable sound pressure level (SPL) in dB for frequency (Fn):

| | |
|---|---|
| 1. Plate movement limit | (Xmax) = 12.5 mm |
| 2. Plate radiating area | radius (Spr) = 101.6 mm |
| 3. Achievable S.P.L. in | $dBSPL(fn) = 20 \log \left( Xmax\ (fn)^2 \frac{Spr^2}{1180} \right)$ |

The term 1180 in the equation 3 directly above is the standard acoustic reference for 0 dB or the threshold of hearing in micrometers per Newton per square meter.

It is readily apparent that by employing the four step procedure above in accordance with the various formulae provided, speaker designs for other drivers of different sizes, and having different mechanical mass, may be employed to design appropriate speaker enclosures of the type shown in FIGS. 1, 2 and 9, and of other shapes embodying the design characteristics of the invention.

For different volumes of the upper enclosure or the box in which the dynamic loudspeaker 22 is sealed, the following table shows the relationship between the volume of the upper enclosure and the system resonance and the range (Qs):

TABLE 1

| SYSTEM RESONANCE (Hz) | RANGE (Qs) | VOLUME (box) (in cubic inches) |
|---|---|---|
| 47.833 Hz | 0.5 | 1,333.00 |
| 52.616 Hz | 0.55 | 1,053.00 |

TABLE 1-continued

| SYSTEM RESONANCE (Hz) | RANGE (Qs) | VOLUME (box) (in cubic inches) |
| --- | --- | --- |
| 57.4 Hz | 0.6 | 855.71 |
| 62.183 Hz | 0.65 | 711.008 |
| 66.966 Hz | 0.7 | 601.209 |
| 71.75 Hz | 0.75 | 515.676 |
| 76.533 Hz | 0.8 | 447.604 |

The foregoing description of the preferred embodiments of the invention is to be considered as illustrative, and not as limiting. Various changes will occur to those skilled in the art for performing substantially the same function, in substantially the same way, to achieve substantially the same result without departing from the true scope of the invention as defined in the appended claims.

I claim:

1. A speaker enclosure including in combination:

a primary sealed enclosure having a first predetermined volume and having at least first and second flat walls therein with a first aperture of predetermined dimensions, and having a first predetermined area, through said first wall for mounting a loudspeaker of complementary dimensions to said predetermined dimensions of said first aperture therein;

a second aperture through said second wall of said primary sealed enclosure, said second aperture having second predetermined dimensions;

a first passive plate movably mounted in said second aperture in said second wall sealing said second aperture against passage of air therethrough;

a second passive plate spaced from said first passive plate and movably mounted in said second aperture further sealing said second aperture against passage of air therethrough to form a sealed airspace between said first and second passive plates having a volume not greater than twenty percent of said first predetermined volume, wherein said first and second passive plates are independently mounted and are separated by a predetermined distance selected to permit each of said first and second passive plates to undergo a full range of independent acoustic excursions without mechanically interfering with one another; and an elongated sealed cavity attached to said second wall of said primary enclosure over said second passive plate and having an open slot therein in a plane perpendicular to said second wall, said open slot having a second predetermined area which is less than said first predetermined area.

2. The combination according to claim 1 wherein said first and second walls are parallel to one another.

3. The combination according to claim 1 wherein said first and second walls are mutually perpendicular walls.

4. The combination according to claim 1 wherein said first and second passive plates are circular passive plates and said second aperture is a circular aperture.

5. The combination according to claim 1 wherein said first and second passive plates are oval shaped and said second aperture is an oval shaped aperture.

6. A speaker enclosure including in combination:

a primary sealed enclosure having a first predetermined volume and having at least first and second flat walls therein with a first aperture of predetermined dimensions, and having a first predetermined area, through said first wall for mounting a loudspeaker of complementary dimensions to said predetermined dimensions of said first aperture therein, wherein the loudspeaker has a radiating area of Sd and a moving mass of a first predetermined amount;

a second aperture through said second wall of said primary sealed enclosure, said second aperture having second predetermined dimensions;

a first passive plate movably mounted in said second aperture in said second wall sealing said second aperture against passage of air therethrough;

a second passive plate spaced from said first passive plate and movably mounted in said second aperture to form a sealed airspace between said first and second passive plates having a volume not greater than twenty percent of said first predetermined volume, wherein said first and second passive plates are independently mounted and are separated by a predetermined distance selected to permit each of said first and second passive plates to undergo a full range of independent acoustic excursions without mechanically interfering with one another, said first and second passive plates having a radiating area of Sp which is greater than said first predetermined area of said first aperture and said passive plates have a combined moving mass which is greater than said first predetermined amount, producing a plate reflected mass, MR, as set forth in the following formula $MR=Mmp\times(Sd/Sp)^2$, where Mmp is the mechanical mass of each of said plates; and an elongated sealed cavity attached to said second wall of said primary enclosure over said second passive plate and having an open slot therein in a plane perpendicular to said second wall, said open slot having a second predetermined area which is less than said first predetermined area.

7. The combination according to claim 6 wherein said first and second passive plates are circular passive plates and said second aperture is a circular aperture.

8. The combination according to claim 7 wherein said first and second walls are parallel to one another.

9. The combination according to claim 7 wherein said first and second walls are mutually perpendicular walls.

10. The combination according to claim 6 wherein said first and second passive plates are oval shaped and said second aperture is an oval shaped aperture.

11. The combination according to claim 10 wherein said first and second walls are parallel to one another.

12. The combination according to claim 10 wherein said first and second walls are mutually perpendicular walls.

13. A speaker enclosure including in combination:

first and second sealed enclosures sharing a common wall of a first predetermined thickness;

a first aperture through said common wall between said first and second sealed enclosures;

first and second spaced apart passive plates movably mounted in said first aperture to block passage of air through said first aperture forming a third sealed enclosure therebetween and sealing said first aperture against passage of air therethrough;

a second aperture in said first sealed enclosure for mounting a loudspeaker in sealed relationship therein; and a third open aperture in said second sealed enclosure functioning as a port in communication with ambient air surrounding said enclosures.

14. The combination according to claim 13 wherein said first and second passive plates are mounted in planes parallel to one another.

15. The combination according to claim 14 wherein said third sealed enclosure has a volume which is less than the volume of said first and second sealed enclosures.

16. The combination according to claim 15 wherein said first and second plates each have an outer periphery and each of said plates is mounted, respectively, in said first aperture with resilient hinges located about the outer periphery of said first and second plates.

17. The combination according to claim 16 wherein said third aperture has a cross-sectional area which is less than cross-sectional areas of each of said first and second apertures.

18. The combination according to claim 17 wherein said third aperture is located in a plane which is perpendicular to the plane of said first and second plates.

19. The combination according to claim 13 wherein said first and second passive plates are separated by a predetermined distance established by said first predetermined thickness of said common wall to permit each of said first and second passive plates to undergo a full range of independent acoustic excursions without mechanically interfering with one another.

20. The combination according to claim 19 wherein said first and second plates each have an outer periphery and each of said plates is connected, respectively, in said first aperture with resilient hinges located about the outer periphery of said first and second plates.

21. The combination according to claim 20 wherein said loudspeaker has a radiating area of Sd and a moving mass of a first predetermined amount, said first and second passive plates each have a radiating area of Sp, and said plates have a combined moving mass which is greater than said first predetermined amount, producing a plate reflected mass, MR, as set forth in the following formula $MR=Mmp\times(Sd/Sp)^2$, where Mmp is the mechanical mass of each of said plates.

* * * * *